United States Patent
Mashita et al.

(10) Patent No.: US 7,713,833 B2
(45) Date of Patent: May 11, 2010

(54) METHOD FOR MANUFACTURING SEMICONDUCTOR DEVICE

(75) Inventors: Hiromitsu Mashita, Yokohama (JP); Toshiya Kotani, Machida (JP); Hidefumi Mukai, Kawasaki (JP); Fumiharu Nakajima, Yokohama (JP); Chikaaki Kodama, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 12/557,111

(22) Filed: Sep. 10, 2009

(65) Prior Publication Data

US 2010/0081265 A1 Apr. 1, 2010

(30) Foreign Application Priority Data

Sep. 30, 2008 (JP) ............ P2008-255638

(51) Int. Cl.
 *H01L 21/76* (2006.01)
(52) U.S. Cl. ............ 438/424; 438/266; 438/427; 430/313; 257/E21.038; 257/E21.409
(58) Field of Classification Search ............ 438/266, 438/424, 427, 946, 947; 430/313
See application file for complete search history.

(56) References Cited

U.S. PATENT DOCUMENTS 6,063,688 A 5/2000 Doyle et al.
2007/0196986 A1* 8/2007 Ichige et al. ............ 438/266
2007/0238053 A1 10/2007 Hashimoto
2008/0014510 A1* 1/2008 Fujisawa et al. ............ 430/5
2008/0162781 A1 7/2008 Haller et al.
2008/0303115 A1* 12/2008 Miyazaki et al. ............ 257/506
2009/0039519 A1* 2/2009 Saito et al. ............ 257/773

* cited by examiner

*Primary Examiner*—Alexander G Ghyka
(74) *Attorney, Agent, or Firm*—Finnegan, Henderson, Farabow, Garrett & Dunner, L.L.P.

(57) ABSTRACT

According to an aspect of the present invention, there is provided a method of manufacturing a semiconductor device, the method including: forming a first film on a target film; forming resist patterns on the first film; processing the first film with the resist patterns to form first patterns including: periodic patterns; and aperiodic patterns; removing the resist patterns; forming a second film over the target film; processing the second film to form second side wall patterns on side walls of the first patterns; removing the periodic patterns; and processing the target film with the aperiodic patterns and the second side wall patterns, thereby forming a target patterns including: periodic target patterns; aperiodic target patterns; and dummy patterns arranged between the periodic target patterns and the aperiodic patterns and arranged periodically with the periodic target patterns.

12 Claims, 2 Drawing Sheets

METHOD FOR MANUFACTURING SEMICONDUCTOR DEVICE

CROSS-REFERENCE TO RELATED APPLICATIONS

This application claims priority from Japanese Patent Application No. 2008-255638 filed on Sep. 30, 2008, the entire contents of which are incorporated herein by reference.

BACKGROUND OF THE INVENTION

1. Field of the Invention

An aspect of the present invention relates to a method of manufacturing a semiconductor device.

2. Description of the Related Art

As a technique for achieving a fine structure of wiring patterns or the like in a semiconductor integrated circuit or the like, there is proposed a pattern forming method in which side wall patterns are formed on side walls of core patterns formed on a target film and in which the target film masked with the side wall patterns or patterns embedded in between the side wall patterns are processed to form wiring patterns, gate electrodes, etc. (e.g. see U.S. Pat. No. 6,063,688). By such method, for example, line-and-space-shaped periodic patterns can be formed.

In the periodic patterns such as line-and-space patterns, even when end patterns and a central pattern are designed to be equal, each end pattern and the central pattern are different in arrangement environment. Accordingly, each end pattern and the central pattern are different in the influence of a proximity effect caused in a manufacturing process, and there is a possibility that dimensional error may occur.

SUMMARY OF THE INVENTION

According to an aspect of the present invention, there is provided a method of manufacturing a semiconductor device, the method including: forming a first film on a target film; forming resist patterns on the first film; processing the first film with the resist patterns as a mask, thereby forming first patterns including: periodic patterns arranged periodically; and aperiodic patterns arranged aperiodically with respect to the periodic patterns; removing the resist patterns; forming a second film on the target film to cover the first patterns; processing the second film to reveal the target film, thereby forming second side wall patterns on side walls of the first patterns; selectively removing the periodic patterns of the first patterns to leave the aperiodic patterns of the first patterns; and processing the target film with the aperiodic patterns of the first patterns and the second side wall patterns as a mask, thereby forming a target patterns including: periodic target patterns arranged periodically; aperiodic target patterns arranged adjacent to both end parts of the periodic target patterns and arranged aperiodically with respect to the periodic target patterns; and dummy patterns arranged between the periodic target patterns and the aperiodic patterns and arranged periodically with respect to the periodic target patterns.

Another aspect of the present invention, there is provided a memory device including: a semiconductor substrate; a insulating film formed on the semiconductor substrate; a plurality of word lines arranged periodically; two of select gates arranged at both ends of the word lines, each select gate being arranged aperiodically with respect to the word lines; and two of dummy patterns arranged between the word lines and each select gate, each dummy pattern being arranged periodically with respect to the word lines.

DETAILED DESCRIPTION OF THE INVENTION

An embodiment of the invention will be described below in detail with reference to the drawings.

Embodiment

A semiconductor device manufacturing method according to this embodiment will be described with reference to FIGS. 1A and 1B and FIGS. 2A to 2F. Forming of gate patterns of a NAND flash memory by the semiconductor device manufacturing method will be described here.

Figure 1A:
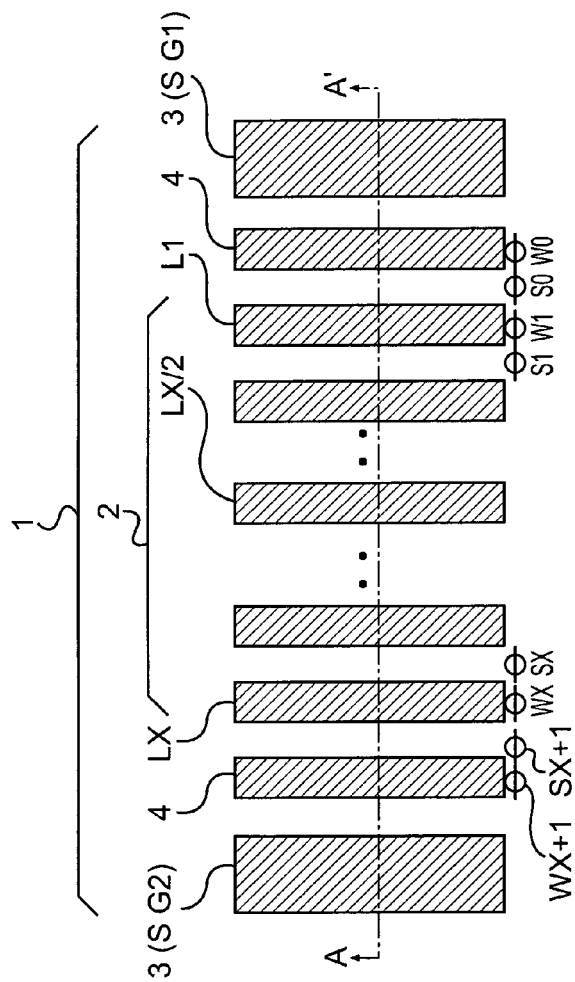
FIGS. 1A and 1B illustrate a pattern in a semiconductor device according to an embodiment of the invention.
Figure 1B:
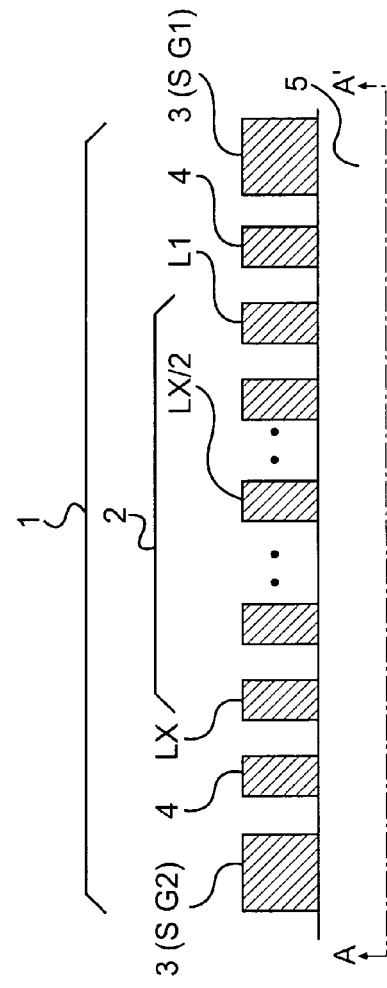

FIGS. 1A and 1B illustrate gate patterns of an NAND flash memory. FIG. 1A shows a plan view of the gate patterns. FIG. 1B shows a sectional view of the gate patterns taken along the broken line A-A' in FIG. 1A.

As shown in FIG. 1A, the gate patterns 1 include: line-and-space-shaped patterns 2 (line-and-space patterns 2) having a number X of parallel line patterns (L1 to LX) arranged periodically with given spaces; and aperiodic patterns 3 disposed aperiodically adjacent to opposite end portions of the line-and-space patterns 2. The line-and-space patterns 2 are functioning as word lines, and the periodic patterns 3 are functioning as select gate patterns SG1 and SG2.

The fact that "the select gate patterns are aperiodic" means that the select gate patterns are aperiodic relative to the line-and-space patterns 2. Accordingly, the select gate patterns may be periodic to each other or may be periodic relative to other patterns (except dummy patterns which will be described later) than the line-and-space patterns 2.

In this embodiment, in the line-and-space patterns 2, the line sizes (W1 to WX) and the space sizes (S1 to SX) are equal to one another. The line size, the space size and the number of lines can be set respectively arbitrarily. For example, the line size and the space size can be set to be in a range of from about 30 nm to about 60 nm and the number of lines can be set to be 16, 32, 64 or 128. Though not shown, extracted patterns on which contacts with upper layer wiring are to be disposed are connected to the line patterns of the line-and-space patterns 2 respectively.

The distance between each select gate pattern SG1 or SG2 and the line-and-space patterns 2 is larger than the line size and space size of the line-and-space patterns 2. For example, the distance between each select gate pattern SG1 or SG2 and the line-and-space patterns 2 can be set to be about three times as much as the line size and space size.

In this embodiment, a dummy pattern 4 is provided between the line-and-space periodic patterns 2 and each aperiodic pattern 3. The dummy patterns 4 are formed so as to be electrically independent of the periodic patterns 2 and the aperiodic patterns 3.

The dummy patterns 4 are line-shaped patterns parallel with the respective line patterns of the line-and-space patterns 2. The dummy patterns 4 are formed adjacent to the line-and-space patterns 2. Each dummy pattern 4 is formed distant from a corresponding end line pattern (L1, LX) of the lineand-space patterns 2 by the same size (S0, SX+1) as the space size (S1 to SX) of the line-and-space patterns 2. Accordingly, the distance between each end line pattern (L1, LX) of the line-and-space patterns 2 and a pattern adjacent to the end line pattern (L1, LX) is equalized to the distance between the central line pattern (LX/2) of the line-and-space patterns 2 and a pattern adjacent to the central line pattern (LX/2), so that the same peripheral environment is provided in each line pattern.

The size of each dummy pattern 4 is equal to the size of each line pattern (L1 to LX) of the line-and-space patterns 2. Accordingly, the size of each end line pattern (L1, LX) of the line-and-space patterns 2 and the size of the central line pattern (LX/2) of the line-and-space patterns 2 are equalized to the size of a pattern adjacent to the end line pattern (L1, LX) and the size of a pattern adjacent to the central line pattern (LX/2), so that the same peripheral environment is provided in each line pattern.

As shown in FIG. 1B, the line-and-space patterns 2, the select gate patterns (aperiodic patterns 3) and the dummy patterns 4 are formed on a semiconductor substrate 5 through a gate insulating film (not shown) and made of polysilicon materials respectively.

A method of forming the gate patterns 1 of the semiconductor device shown in FIGS. 1A and 1B will be described below with reference to FIGS. 2A to 2F. FIGS. 2A to 2F are sectional views illustrating the method of forming the gate patterns 1 of the semiconductor device shown in FIG. 1B.

Figure 2A:
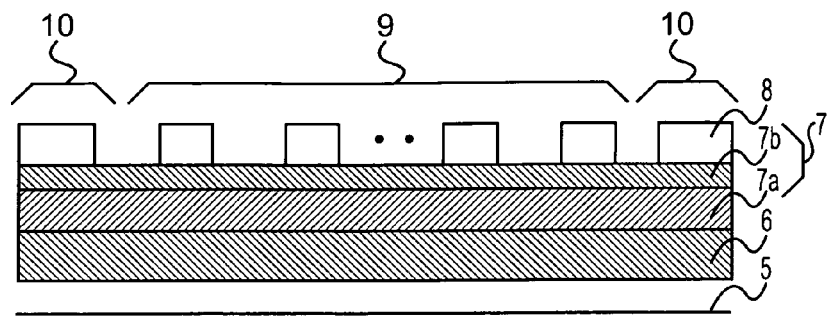
FIGS. 2A to 2F are sectional views illustrating a method of manufacturing a semiconductor device according to the embodiment.

First, as shown in FIG. 2A, a target film 6 of a gate pattern material such as a polysilicon film is formed on a semiconductor substrate 5 through a gate insulating film (not shown). Then, a first film 7 of a laminated structure having a silicon oxide film 7a and an amorphous silicon film 7b is formed on the target film 6. A resist film is formed on the first film 7 through an antireflection film (not shown) in a coating manner. Then, after a photo mask is disposed in an exposure device, a mask pattern image is formed in the resist film by the exposure device. The resist film is developed to form resist patterns 8.

The resist patterns 8 include: line-and-space patterns 9 having a number (1+X/2) of parallel line patterns arranged periodically with given spaces; and aperiodic patterns 10 disposed adjacent to the line-and-space patterns.

Figure 2B:
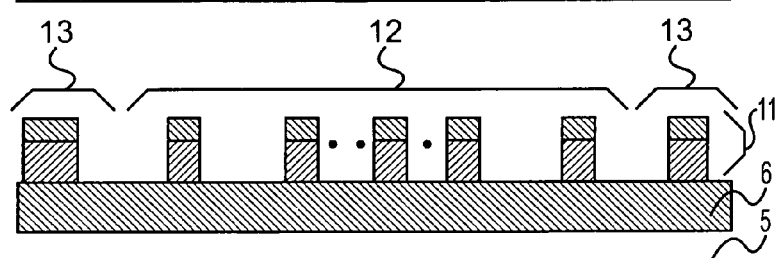

Then, as shown in FIG. 2B, the amorphous silicon film 7b masked with the resist patterns 8 is processed. Then, the resist patterns 8 are removed, and the amorphous silicon film 7b is subjected to slimming in an etching manner. Then, the silicon oxide film 7a masked with the slimmed amorphous silicon film 7b is processed.

Like the resist patterns 8, first patterns 11 formed in the first film 7 include: line-and-space patterns 12 having a number (1+X/2) of parallel line patterns arranged periodically; and aperiodic patterns 13 disposed adjacent to the line-and-space patterns. The line-and-space patterns 12 are formed so that the ratio of the line size to the space size is 1:3.

In this embodiment, as the first film 7 formed on the target film 6, a laminated film having a silicon oxide film 7a and an amorphous silicon film 7b is used. However, a laminated film formed of other materials such as a laminated film having a carbon film and an amorphous silicon film, a laminated film having a carbon film and an SOG film or a single layer film such as a silicon nitride film may be used as the first film 7.

In this embodiment, the amorphous silicon film 7b as an upper layer portion of the first film 7 is subjected to slimming. However, the amorphous silicon film 7b masked with the resist patterns 8 may be processed after the resist patterns 8 are subjected to slimming. In this case, the step of applying slimming to the amorphous silicon film 7b can be removed.

Figure 2C:
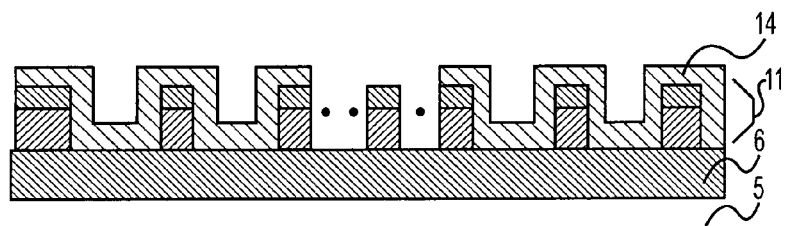

Then, as shown in FIG. 2C, a second film 14 such as an oxide film, a nitride film, etc. is formed on the target film 6 and on the first patterns 11 so that the first patterns 11 are covered with the second film 14.

Figure 2D:
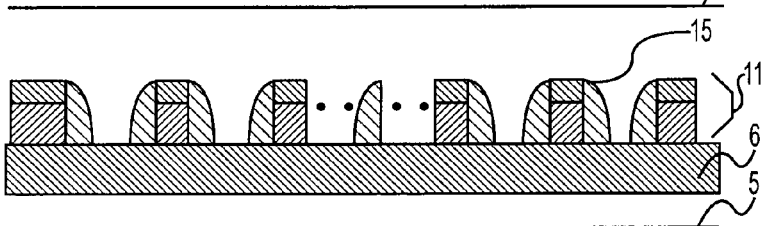

Then, as shown in FIG. 2D, the second film 14 is etched to form second side wall patterns 15 on side walls of the first patterns 11.

Figure 2E:
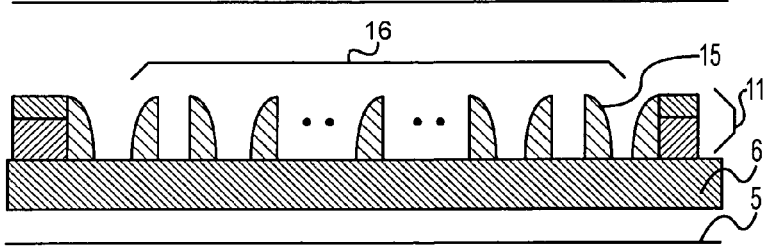

Then, as shown in FIG. 2E, periodically arranged patterns 12 are selectively removed from the first patterns 11. That is, a resist film is applied on the target film 6, the first patterns 11 and the second side wall patterns 15, the resist film is processed to have patterns selectively revealing the periodically arranged patterns 12 of the first patterns 11 and the second side wall patterns 15 formed on side walls thereof, and the revealed periodic patterns 12 are removed with the resist patterns.

As a result of selectively removing the first patterns 11, the second side wall patterns 15 are formed as line-and-space patterns 16 having a number (X+2) of line patterns parallel with one another and periodically arranged. The line-and-space patterns 16 are formed so that the ratio of the line size to the space size is 1:1.

Figure 2F:
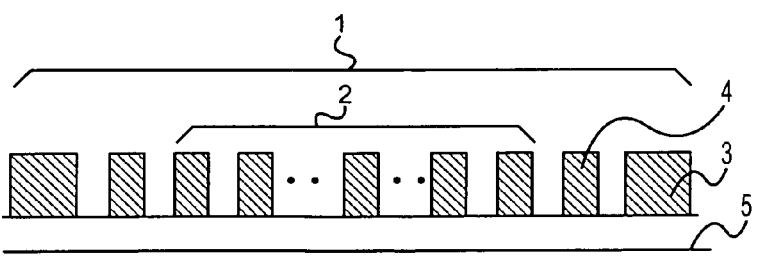

Finally, as shown in FIG. 2F, the target film 6 masked with the first patterns 11 and the second side wall pattern 15 is processed to form gate patterns 1 as shown in FIG. 1B.

In this manner, line-and-space patterns 2, as word lines, having a number X of line patterns arranged periodically and each separated from the adjacent line patterns, aperiodic select gate patterns 3 arranged adjacent to the line-and-space patterns, and electrically-independent dummy patterns 4 formed between the line-and-space patterns 2 and the select gate patterns 3 are simultaneously formed on the semiconductor substrate 5 as shown in FIG. 1B.

The dummy patterns 4 and the line-and-space patterns 2 formed in the target film 6 are formed simultaneously with the second side wall patterns 15 of periodic line-and-space patterns as a mask. The dummy patterns 4 are provided as two line patterns respectively adjacent to end line patterns of the line-and-space patterns 2 to be periodic with respect to the line-and-space patterns 2.

For this reason, the distance (space size) between each end line of the line-and-space patterns 2 and a pattern adjacent to the end line and the distance (space size) between the central line of the line-and-space patterns 2 and a pattern adjacent to the central line are equalized. Further, the size of a pattern adjacent to the end line of the line-and-space patterns 2 and the size of a pattern adjacent to the central line of the line-and-space patterns 2 are equalized.

According to this embodiment, each end line of the periodic line-and-space patterns 2 and the central line of the periodic line-and-space patterns 2 have the same peripheral pattern environment. Accordingly, dimensional error caused in an etching process or the like can be suppressed.

In this embodiment, the dummy patterns 4 are formed by use of the second side wall patterns 15 that are used to form fine-size target patterns in the target film 6. As a result, the dummy patterns 4 can be formed while preventing the chip area from being increased.

Generally, in the semiconductor device, two resist dummy regions are provided between periodic patterns and aperiodic patterns. For example, if two resist patterns are provided correspondingly for the two dummy regions, since two sidewall patterns are formed at both sides of one resist pattern, two dummy patterns are formed in each of the two dummy regions.

In this embodiment, only one resist pattern in total is formed to provide the two dummy regions, and the one dummy pattern 4 is respectively assigned between the periodic patterns 2 and each aperiodic pattern 3. Therefore, the area required for providing the dummy regions are reduced as compared with the above comparison example.

According to this embodiment, while suppressing dimensional error of patterns, pattern area in the lithography is prevented so that chip area of the semiconductor device is suppressed.

In this embodiment, formation of gate patterns of an NAND flash memory is described. However, the invention can be applied to formation of other patterns of semiconductor device. For example, when this embodiment is applied to a method of manufacturing a semiconductor device having periodic patterns and aperiodic patterns, dummy patterns can be formed therebetween.

What is claimed is:

1. A method of manufacturing a semiconductor device, the method comprising:
    forming a first film on a target film;
    forming resist patterns on the first film;
    processing the first film with the resist patterns as a mask, thereby forming first patterns including:
        periodic patterns arranged periodically; and
        aperiodic patterns arranged aperiodically with respect to the periodic patterns;
    removing the resist patterns;
    forming a second film on the target film to cover the first patterns;
    processing the second film to reveal the target film, thereby forming second side wall patterns on side walls of the first patterns;
    selectively removing the periodic patterns of the first patterns to leave the aperiodic patterns of the first patterns; and
    processing the target film with the aperiodic patterns of the first patterns and the second side wall patterns as a mask, thereby forming a target patterns including:
        periodic target patterns arranged periodically;
        aperiodic target patterns arranged adjacent to both end parts of the periodic target patterns and arranged aperiodically with respect to the periodic target patterns; and
        dummy patterns arranged between the periodic target patterns and the aperiodic patterns and arranged periodically with respect to the periodic target patterns.

2. The method according to claim 1,
wherein two of the dummy patterns are provided, and
wherein each dummy pattern is provided between each end part of the periodic target patterns and the corresponding part of the aperiodic target patterns.

3. The method according to claim 1,
wherein the periodic target patterns include line-and-space patterns, and
wherein the dummy patterns include line patterns.

4. The method according claim 1,
wherein the periodic target patterns and the aperiodic target patterns include gate patterns.

5. The method according to claim 1,
wherein the periodic target patterns include word lines, and
wherein the aperiodic target patterns include select gate patterns.

6. The method according to claim 1,
wherein, in the step of forming the target patterns, X of the periodic target patterns are formed, X being even number.

7. The method according to claim 6,
wherein, in the step of forming the first patterns, (1+X/2) of the periodic patterns are formed.

8. The method according to claim 6,
wherein the step of selectively removing the periodic patterns includes:
    forming a second resist film on the target film to cover the first patterns and the second side wall patterns;
    processing the second resist film, thereby forming second resist patterns revealing the periodic patterns of the first patterns and a part of the second side wall patterns formed on the side walls thereof; and
    removing the revealed periodic patterns of the first patterns; and
    removing the second resist patterns.

9. The method according to claim 1, further comprising:
slimming the first patterns, after forming the first patterns.

10. The method according to claim 1, further comprising:
slimming the resist patterns, before forming the first patterns.

11. The method according to claim 1,
wherein, in the step of forming the target patterns, the periodic target patterns, the aperiodic target patterns and the dummy patterns are simultaneously formed.

12. The method according to claim 1,
wherein a size of each dummy pattern is smaller than a minimum lithography resolution.

* * * * *

UNITED STATES PATENT AND TRADEMARK OFFICE
CERTIFICATE OF CORRECTION

| | | |
|---|---|---|
| PATENT NO. | : 7,713,833 B2 | Page 1 of 1 |
| APPLICATION NO. | : 12/557111 | |
| DATED | : May 11, 2010 | |
| INVENTOR(S) | : Mashita et al. | |

It is certified that error appears in the above-identified patent and that said Letters Patent is hereby corrected as shown below:

Title page, Item (57), in the Abstract, line 11, change "forming a" to --forming--.

Claim 1, column 5, line 40, change "forming a" to --forming--.

Claim 4, column 6, line 10, change "according claim," to --according to claim--.

Claim 6, column 6, line 19, change "being even" to --being an even--.

Signed and Sealed this

Seventeenth Day of August, 2010

David J. Kappos
*Director of the United States Patent and Trademark Office*